(12) United States Patent
Laskar

(10) Patent No.: US 10,498,382 B2
(45) Date of Patent: Dec. 3, 2019

(54) MILLIMETER-WAVE MIXED-SIGNAL AUTOMATIC GAIN CONTROL

(71) Applicant: ANAYAS360.COM, LLC, Sunnyvale, CA (US)

(72) Inventor: Joy Laskar, Los Altos, CA (US)

(73) Assignee: Maja Systems, Milpitas, CA (US)

( * ) Notice: Subject to any disclaimer, the term of this patent is extended or adjusted under 35 U.S.C. 154(b) by 110 days.

(21) Appl. No.: 14/066,508

(22) Filed: Oct. 29, 2013

(65) Prior Publication Data

US 2014/0120853 A1    May 1, 2014

Related U.S. Application Data

(60) Provisional application No. 61/720,306, filed on Oct. 30, 2012, provisional application No. 61/720,311, (Continued)

(51) Int. Cl.
*H04B 1/06* (2006.01)
*H04B 7/00* (2006.01)
(Continued)

(52) U.S. Cl.
CPC .......... *H04B 1/40* (2013.01); *G06F 13/4068* (2013.01); *G06F 13/42* (2013.01); *H03G 3/3042* (2013.01);
(Continued)

(58) Field of Classification Search
USPC ............... 455/240.1–242.2, 244.1–247.1, 455/251.1–253.2, 226.2
See application file for complete search history.

(56) References Cited

U.S. PATENT DOCUMENTS 5,732,341 A * 3/1998 Wheatley, III ............ H03F 3/72
455/219
5,920,235 A    7/1999 Beards et al.
(Continued)

FOREIGN PATENT DOCUMENTS

WO    WO 95/26094    9/1995

OTHER PUBLICATIONS

International Search Report and Written Opinion re Application No. PCT/US2013/67300 dated Jan. 24, 2014.
(Continued)

*Primary Examiner* — Edward Urban
*Assistant Examiner* — Rui Hu
(74) *Attorney, Agent, or Firm* — Useful Arts IP

(57) ABSTRACT

A wireless data transceiver comprises a voltage controlled oscillator configured to generate a first time-varying signal. The transceiver further comprises an antenna configured to receive a signal wirelessly over a network. The transceiver further comprises an amplifier configured to amplify the signal. The transceiver further comprises a frequency mixer coupled to the voltage controlled oscillator and the amplifier. The frequency mixer is configured to generate a second time-varying signal based on the first time-varying signal and the amplified signal. The transceiver further comprises a power detector configured to measure a characteristic of the second time-varying signal. The transceiver further comprises an automatic gain control circuit coupled to the power detector and the amplifier. The automatic gain control circuit is configured to adjust operation of the amplifier based on the measured characteristic, a minimum power setting, and a maximum power setting.

19 Claims, 13 Drawing Sheets

Related U.S. Application Data filed on Oct. 30, 2012, provisional application No. 61/720,321, filed on Oct. 30, 2012.

(51) Int. Cl.

| | | |
|---|---|---|
| *H04B 1/40* | (2015.01) | |
| *H04B 1/403* | (2015.01) | |
| *H03G 3/30* | (2006.01) | |
| *G06F 13/42* | (2006.01) | |
| *G06F 13/40* | (2006.01) | |

(52) U.S. Cl.
CPC .......... *H04B 1/403* (2013.01); *Y02B 60/1228* (2013.01); *Y02B 60/1235* (2013.01)

(56) References Cited

U.S. PATENT DOCUMENTS

| | | | |
|---|---|---|---|
| 6,044,253 A * | 3/2000 | Tsumura | H03G 3/001 455/234.1 |
| 6,052,566 A * | 4/2000 | Abramsky | H03G 3/3068 455/249.1 |
| 6,160,795 A | 12/2000 | Hosemann | |
| 6,208,849 B1 * | 3/2001 | Cho | H04B 1/109 455/296 |
| 6,385,033 B1 | 5/2002 | Javanifard et al. | |
| 6,397,044 B1 | 5/2002 | Nash et al. | |
| 6,411,494 B1 | 6/2002 | Watt | |
| 6,466,775 B1 | 10/2002 | Franca-Neto | |
| 6,771,719 B1 * | 8/2004 | Koyama | H03G 3/3068 375/345 |
| 6,978,117 B2 * | 12/2005 | Zerod | H03G 3/3068 455/226.3 |
| 7,076,224 B2 * | 7/2006 | Giry-Cassan | H03G 3/001 330/254 |
| 7,116,955 B2 * | 10/2006 | Schaffer | H03G 3/3068 455/234.1 |
| 7,242,915 B2 * | 7/2007 | Shi | H03F 1/32 375/345 |
| 7,299,021 B2 * | 11/2007 | P rssinen | H04B 1/109 375/345 |
| 7,460,848 B1 * | 12/2008 | Brunn | H04B 17/318 327/77 |
| 7,489,201 B2 | 2/2009 | Sarkar et al. | |
| 7,493,506 B2 | 2/2009 | Balasubramanian et al. | |
| 7,551,238 B2 * | 6/2009 | Motte | H03G 1/0088 348/528 |
| 7,593,704 B2 | 9/2009 | Pinel et al. | |
| 7,630,686 B2 * | 12/2009 | Fukutani | H04B 1/1027 375/344 |
| 7,864,113 B2 | 1/2011 | Laskar et al. | |
| 7,933,369 B2 * | 4/2011 | Choi | H03G 3/001 375/345 |
| 8,067,987 B2 | 11/2011 | Sen et al. | |
| 8,081,948 B2 | 12/2011 | Pinel et al. | |
| 8,355,687 B2 * | 1/2013 | Wood | H03G 3/3078 455/226.2 |
| 8,378,874 B2 | 2/2013 | Pinel et al. | |
| 8,473,535 B2 | 6/2013 | Perumana et al. | |
| 8,498,600 B2 * | 7/2013 | Chan | H03G 3/3078 455/226.3 |
| 8,605,826 B2 | 12/2013 | Juntunen et al. | |
| 8,868,017 B2 * | 10/2014 | Kang | H04B 17/0057 327/350 |
| 8,983,418 B2 * | 3/2015 | Ibrahim | H03G 3/3068 455/245.1 |
| 2001/0019144 A1 | 9/2001 | Roy | |
| 2001/0055956 A1 * | 12/2001 | Konishi | H03G 1/04 455/245.2 |
| 2002/0015458 A1 * | 2/2002 | Van Sinderen | H03G 3/001 375/345 |
| 2002/0142745 A1 * | 10/2002 | Kang | H03G 3/3068 455/232.1 |
| 2003/0089940 A1 | 5/2003 | Baker et al. | |
| 2003/0157912 A1 * | 8/2003 | Atkinson | B01F 5/246 455/234.1 |
| 2003/0162518 A1 * | 8/2003 | Baldwin | H04B 1/28 455/253.2 |
| 2004/0042707 A1 | 3/2004 | Imai et al. | |
| 2004/0097209 A1 * | 5/2004 | Haub | H03G 3/001 455/242.1 |
| 2004/0174655 A1 | 9/2004 | Tsai et al. | |
| 2005/0088236 A1 | 4/2005 | Matsumoto | |
| 2005/0130615 A1 * | 6/2005 | Darabi | H03G 3/3052 455/232.1 |
| 2005/0186930 A1 | 8/2005 | Rofougaran et al. | |
| 2006/0046677 A1 * | 3/2006 | Nakano | H04B 17/318 455/226.2 |
| 2006/0186893 A1 | 8/2006 | Schmidt | |
| 2006/0194554 A1 * | 8/2006 | Tsividis | H04B 1/109 455/226.2 |
| 2006/0222126 A1 | 10/2006 | Raphaeli | |
| 2006/0293009 A1 * | 12/2006 | Kobayashi | H03G 3/3036 455/232.1 |
| 2007/0072361 A1 | 3/2007 | Tu et al. | |
| 2007/0243843 A1 * | 10/2007 | Shalash | H03G 3/3068 455/234.1 |
| 2008/0081458 A1 | 4/2008 | Lin et al. | |
| 2008/0101525 A1 | 5/2008 | Wu | |
| 2008/0160947 A1 * | 7/2008 | Xin | H03G 3/3068 455/247.1 |
| 2008/0204096 A1 | 8/2008 | Agarwal et al. | |
| 2008/0296731 A1 | 12/2008 | Block et al. | |
| 2009/0247106 A1 * | 10/2009 | Da Graca | H04B 1/1036 455/240.1 |
| 2009/0298454 A1 * | 12/2009 | Ikeda | H03G 3/3068 455/234.1 |
| 2010/0080270 A1 | 4/2010 | Chen et al. | |
| 2010/0123215 A1 | 5/2010 | Pan et al. | |
| 2010/0216418 A1 * | 8/2010 | Wagner | H03G 3/001 455/240.1 |
| 2010/0261447 A1 * | 10/2010 | Lu | H03G 3/3068 455/253.2 |
| 2011/0002373 A1 | 1/2011 | Jeon | |
| 2011/0039554 A1 | 2/2011 | Bims | |
| 2011/0102074 A1 | 5/2011 | Buer | |
| 2011/0108948 A1 | 5/2011 | Kim et al. | |
| 2011/0221659 A1 | 9/2011 | King et al. | |
| 2011/0239063 A1 | 9/2011 | Zerbe et al. | |
| 2011/0256663 A1 | 10/2011 | Hollis | |
| 2012/0105147 A1 | 5/2012 | Harris | |
| 2012/0110106 A1 | 5/2012 | DeLescure et al. | |
| 2012/0188029 A1 | 7/2012 | Chen et al. | |
| 2012/0207032 A1 | 8/2012 | Chen et al. | |
| 2012/0211812 A1 | 8/2012 | Du et al. | |
| 2012/0244824 A1 | 9/2012 | Entezari et al. | |
| 2012/0262239 A1 | 10/2012 | Taghivand et al. | |
| 2013/0156084 A1 * | 6/2013 | Kang | H04B 17/0057 375/228 |
| 2013/0309989 A1 * | 11/2013 | Haub | H04B 1/10 455/245.1 |

OTHER PUBLICATIONS

International Search Report and Written Opinion re Application No. PCT/US2013/67318 dated Jan. 24, 2014.
PCT Search Report & Written Opinion (PCT/US13/73721) dated Feb. 27, 2014 (14 pages).
PCT Search Report & Written Opinion (PCT/US13/73726) dated Apr. 14, 2014 (29 pages).
International Search Report/Written Opinion in Application No. PCT/US13/73725, dated May 2, 2014.

* cited by examiner

MILLIMETER-WAVE MIXED-SIGNAL AUTOMATIC GAIN CONTROL

CROSS-REFERENCE TO RELATED APPLICATIONS

This application claims priority to U.S. Provisional Patent Application No. 61/720,306, entitled "COMPACT AND LOW-POWER MILLIMETER-WAVE INTEGRATED VCO-UP/DOWN-CONVERTER WITH GAIN-BOOSTING" and filed on Oct. 30, 2012, to U.S. Provisional Patent Application No. 61/720,321, entitled "MILLIMETER-WAVE MIXED-SIGNAL AUTOMATIC GAIN CONTROL" and filed on Oct. 30, 2012, and to U.S. Provisional Patent Application No. 61/720,311, entitled "ADDRESS BASED SERIAL COMMUNICATION INTERFACE FOR CONTROL AND MONITORING OF SYSTEM-ON-CHIP IMPLEMENTATIONS" and filed on Oct. 30, 2012, the entire contents of which disclosures are herewith incorporated by reference.

This application is related to U.S. patent application Ser. No. 14/066,553, entitled "COMPACT AND LOW-POWER MILLIMETER-WAVE INTEGRATED VCO-UP/DOWN-CONVERTER WITH GAIN-BOOSTING" and filed on Oct. 29, 2013, patent application Ser. No. 14/066,514, entitled "ADDRESS BASED SERIAL COMMUNICATION INTERFACE FOR CONTROL AND MONITORING OF SYSTEM-ON-CHIP IMPLEMENTATIONS" and filed on Oct. 29, 2013, and U.S. patent application Ser. No. 14/066,527, entitled "LOW NOISE ANTI LOSS BIASING CIRCUIT" and filed on Oct. 29, 2013, the entire contents of which disclosures are herewith incorporated by reference.

BACKGROUND

Consumer electronics may be equipped with communication devices that permit the wireless transfer of data. For example, consumer electronics can include Wi-Fi chips to communicate via the IEEE 802.11 standard, Bluetooth chips to communicate via the Bluetooth communication protocols, or other such chips. As wireless communication technology has improved, more and more data is being transferred using wireless means.

Traditionally, large data files (e.g., audio files, video files, uncompressed image files, such as in the RAW format, etc.) have been transferred using conventional wired protocols even as wireless communication technology has improved due to the power consumption and delay associated with transferring such large data files. However, the ability to transfer large data files wirelessly from one electronic device to another may benefit both users and the manufacturers of electronic devices that manage these large data files if power consumption and delay can be reduced. Users may see a reduction in incompatibility issues between devices and less clutter. As for manufacturers, the connection ports and cables often dictate the shape and size of the electronic device. In fact, because cables and connectors should be large enough so that they can be handled by adult humans, electronic devices are often designed to be larger than they otherwise need to be. Thus, the ability to transfer large data files wirelessly could significantly reduce the form factor of electronic devices that manage large data files.

Transceivers receive and transmit signals using a variety of analog and/or digital components. Components found in transceivers include low noise amplifiers (LNAs). LNAs are present in the signal path and are configured to increase the amplitude of otherwise weak signals.

SUMMARY

Gain control circuits monitor incoming and outgoing signals and can be used to control LNAs. Thus, if the transceiver is performing at a suboptimal level (e.g., a signal is too weak), the gain control circuits can be used to adjust the behavior of the LNAs, thereby improving transceiver performance. However, gain control circuits are extra components that are otherwise not used to manipulate an incoming or outgoing signal. Gain control circuits increase power consumption and the die area of the transceiver. In addition, gain control circuits typically introduce noise in the signal path while monitoring the incoming and outgoing signals.

Accordingly, an automatic gain control (AGC) circuit is introduced herein that increases the dynamic range of a transceiver without compromising gain, linearity, and/or the noise figure of the transceiver. As described above, AGC circuits monitor incoming and outgoing signals and control LNAs. The AGC circuit described herein can include an existing LNA, an existing down-conversion frequency mixer, a power detector, and a gain control circuit. LNAs, such as an LNA in the signal path, can be designed with programmable gain using digitally-controlled biasing circuits. The power detector can be implemented using at least a portion of an existing down-conversion frequency mixer and used to monitor incoming and/or outgoing signals. Based on measurements obtained by the power detector, a digital gain control circuit can provide digital control instructions to the LNA, thereby forming a digital control loop. The AGC can be implemented in both homodyne and heterodyne receivers.

One aspect of the disclosure provides a wireless data transceiver. The transceiver comprises a voltage-controlled oscillator configured to generate a first time-varying signal. The transceiver further comprises an amplifier configured to amplify an antenna signal having a millimeter wave frequency received from an antenna to produce an amplified signal. The transceiver further comprises a frequency mixer coupled to the voltage controlled oscillator and the amplifier. The frequency mixer may be configured to generate a second time-varying signal based on the first time-varying signal and the amplified signal. The transceiver further comprises a power detector configured to measure a characteristic of the second time-varying signal. The transceiver further comprises an automatic gain control circuit coupled to the power detector and the amplifier. The automatic gain control circuit may be configured to adjust operation of the amplifier based on the measured characteristic, a minimum power setting, and a maximum power setting. The amplifier, the frequency mixer, the power detector, and the automatic gain control circuit may be implemented on-chip in a manner that reduces degradation of the first time-varying signal.

Another aspect of the disclosure provides a wireless data transceiver. The transceiver comprises a voltage-controlled oscillator configured to generate a first time-varying signal. The transceiver further comprises a first amplifier configured to amplify an antenna signal having a millimeter wave frequency received from an antenna to produce an amplified signal. The transceiver further comprises a frequency mixer coupled to the voltage-controlled oscillator and the amplifier. The frequency mixer may be configured to generate a second time-varying signal based on the first time-varying signal and the amplified signal. The transceiver further comprises a second amplifier configured to amplify the second time-varying signal to produce an amplified second time-varying signal. The transceiver further comprises a power detector configured to measure a characteristic of the amplified second time-varying signal. The transceiver further comprises an automatic gain control circuit coupled to the power detector and the amplifier. The automatic gain control circuit may be configured to adjust operation of the first amplifier and the second amplifier based on the measured characteristic, a minimum power setting, and a maximum power setting. The first amplifier, the frequency mixer, the second amplifier, the power detector, and the automatic gain control circuit may be implemented on-chip in a manner that reduces degradation of the first time-varying signal.

Certain aspects, advantages and novel features of the inventions are described herein. It is to be understood that not necessarily all such advantages may be achieved in accordance with any particular embodiment of the inventions disclosed herein. Thus, the inventions disclosed herein may be embodied or carried out in a manner that achieves or selects one advantage or group of advantages as taught herein without necessarily achieving other advantages as may be taught or suggested herein.

BRIEF DESCRIPTION OF THE DRAWINGS

Throughout the drawings, reference numbers can be re-used to indicate correspondence between referenced elements. The drawings are provided to illustrate embodiments of the inventions described herein and not to limit the scope thereof.

DETAILED DESCRIPTION

Introduction

Figure 1:
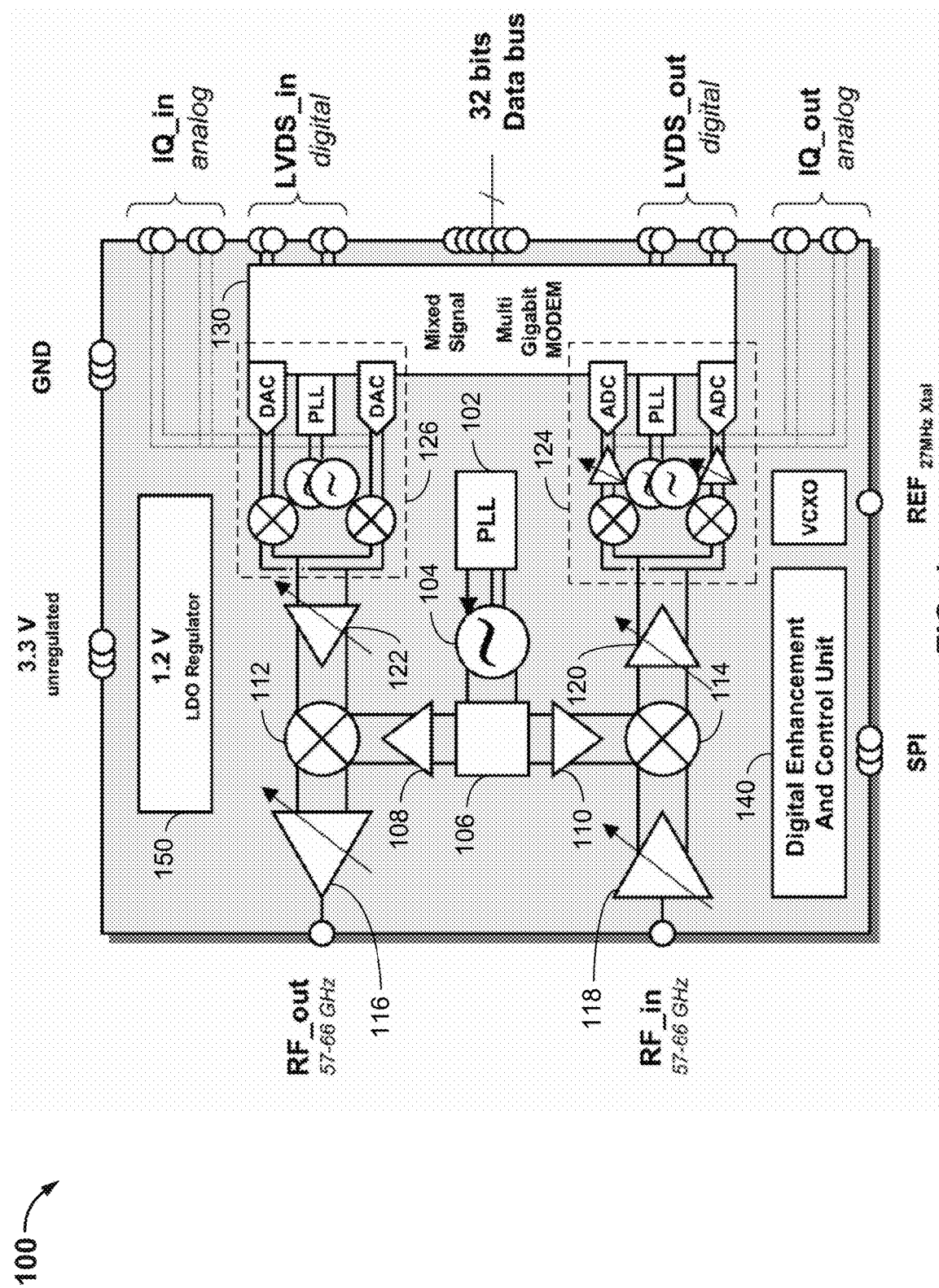
FIG. 1 illustrates a block diagram of an example MMW transceiver.

Transceivers that communicate in the millimeter wave (MMW) frequencies may be able to handle the wireless transfer of large data files at high data rates and low power consumption. Accordingly, described herein are transceivers and components thereof that can achieve the goals described above. While aspects of the disclosure are described herein with respect to MMW frequencies, this is not meant to be limiting. As an example, MMW frequencies may be centered at 60 GHz, although higher and lower frequencies may also be considered MMW frequencies. However, the features described herein apply to any device that communicates at high frequencies (e.g., 2.4 GHz, 5 GHz, 20-120 GHz, higher frequencies than 120 GHz, frequencies lower than 20 GHz, and the like).

In an embodiment, a MMW transceiver may include a MMW front-end, which includes one or more MMW low noise amplifiers (LNAs) and a frequency mixer to down-convert a received signal to the intermediate frequency (IF) or the baseband (BB) frequency. The MMW front-end may further include an automatic gain control (AGC) loop. The MMW AGC of certain embodiments may significantly increase the dynamic range of integrated MMW transceivers beyond that achieved by using gain control only in IF and/or in BB blocks.

MMW LNAs may be designed with programmable gain using digitally-controlled biasing circuits. MMW power detection may be done without significant circuit overhead or additional MMW loading and performance degradation, for example, by using the MMW down-conversion frequency mixer in the receiver lineup as part of the MMW power detector. A digital control loop may enable the MMW AGC to ensure or attempt to ensure that the MMW output power settles between digitally set minimum and maximum values. The MMW transceiver may also save an AGC state in digital registers and load the AGC state rapidly, or instantaneously, at a later time. Under certain conditions, the low power, low cost MMW AGC loop may not only increase system dynamic range without performance degradation, but may also help reduce overall power consumption by reducing the biasing current of the power-hungry MMW LNA when the input power is high.

In existing integrated MMW transceivers, there is no closed loop control of MMW LNA gain due to the difficulty in implementing an MMW AGC without degrading performance and increasing power consumption and die area. Hence, the MMW LNA in existing integrated MMW transceivers may be designed and set for a worst-case input level, leading to suboptimal power efficiency of the overall MMW transceiver. This is because the input MMW power is rarely at the minimum specified level. At high input power, beyond the higher power consumption, the overall receiver chain in existing systems could also saturate because the only gain variation is in IF/BB blocks.

Thus, in certain embodiments, a low power, low cost MMW AGC loop may be beneficial for increasing power efficiency and/or dynamic range without compromising gain, linearity and/or noise figure of the MMW transceiver.

For ease of illustration, various features are described herein with respect to MMW transceivers. However, some or all of these features may also be implemented in other transceivers, receivers, or transmitters designed for wavelengths other than millimeter waves. For example, any of the techniques described herein can be applied to heterodyne and homodyne transceiver architectures using some or all of the MMW VCO/QVCO topologies described herein.

Further, the systems and methods described herein can be implemented in any of a variety of electronic devices, including, for example, cell phones, smart phones, personal digital assistants (PDAs), tablets, mini-tablets, laptops, desktops, televisions, digital video recorders (DVRs), set-top boxes, media servers, audio/visual (A/V) receivers, video game systems, high-definition disc players (such as Blu-ray® players), computer peripherals (such as mice, keyboards, scanners, printers, copiers, and displays), universal serial bus (USB) keys, cameras, routers, switches, other network hardware, radios, stereo systems, loudspeakers, sound bars, appliances, vehicles, digital picture frames, and medical devices, to name a few.

For purposes of summarizing this disclosure, certain aspects, advantages and novel features of several embodiments have been described herein. It is to be understood that not necessarily all such advantages can be achieved in accordance with any particular embodiment of the embodiments disclosed herein. Thus, the embodiments disclosed herein can be embodied or carried out in a manner that achieves one advantage or group of advantages as taught herein without necessarily achieving other advantages as taught or suggested herein.

MMW Transceiver Overview

FIG. 1 illustrates a block diagram of an example MMW transceiver 100. As described above, the MMW transceiver 100 includes various input ports, output ports, analog components, and/or digital components. For example, as illustrated in FIG. 1, the MMW transceiver 100 includes an RF_in port and an RF_out port. The RF_in port is configured to receive MMW signals transmitted by another device within a set frequency range (e.g., a MMW frequency range, such as 57-66 GHz, etc.). The RF_out port is configured to transmit MMW signals to one or more devices within a set frequency range (e.g., a MMW frequency range, such as 57-66 GHz, etc.).

The MMW transceiver 100 further includes components to process signals received via the RF_in port and/or generate signals to be transmitted via the RF_out port. For example, the MMW transceiver 100 includes PLL 102, LO 104, signal distribution block (e.g., splitter) 106, gain blocks 108 and 110, up-conversion frequency mixer 112, down-conversion frequency mixer 114, amplifiers 116, 118, 120, and 122, baseband (BB) blocks 124 and 126, mixed-signal modem 130, digital enhancement and control unit 140, and voltage regulator 150. In an embodiment, PLL 102 and LO 104 generate a LO signal that is passed to the signal distribution block 106 and the gain blocks 108 and 110. The signal distribution block 106 can be configured to distribute the LO signal to multiple components. Gain blocks 108 and 110 amplify the LO signal so that the LO signal can properly drive the frequency mixers 112 and/or 114. However, in other embodiments, as described herein, one of more of the gain blocks 108 and/or 110 can be removed.

In some embodiments, the MMW signal received via the RF_in port is passed to amplifier 118. As an example, amplifier 118 may be a low noise amplifier (LNA). The amplifier 118 can adjust the amplitude of the received MMW signal and pass it to the down-conversion frequency mixer 114. The down-conversion frequency mixer 114 can down-convert the MMW signal from a MMW frequency to an intermediate frequency (IF) or a BB frequency using the LO signal. The down-converted signal then passes through amplifier 114 before being processed by the BB blocks 124.

Likewise, the MMW signal transmitted via the RF_out port is generated based on a signal generated by the BB blocks 126 that passes through amplifier 122 and the LO signal. In an embodiment, the signal generated by the BB blocks 126 is a BB or IF signal. The up-conversion frequency mixer 112 upconverts the BB or IF signal to a MMW signal using the LO signal. The MMW signal may pass through amplifier 116 before transmission occurs.

In some embodiments, the mixed-signal modem 130 is a digital component that transmits data to and receives data from other components of an electronic device (e.g., memory, a processor, etc.). For example, the data can be communicated via a 32-bit data bus. Data received by the mixed-signal modem 130 via the data bus can be transferred to the BB blocks 126. Likewise, data received by the mixed-signal modem 130 from the BB blocks 124 can be transferred to other components of the electronic device via the data bus.

Digital enhancement and control unit 140 provides digital means for controlling the various analog and/or digital components of the MMW transceiver 100. For example, digital enhancement and control unit 140 can adjust the characteristic or performance of the amplifier 118, the down-conversion frequency mixer 114, and so on.

In an embodiment, voltage regulator 150 generates an approximately constant voltage (e.g., 1.2V) that is supplied to one or more components of the MMW transceiver 100. The voltage regulator 150 may generate the approximately constant voltage based on an unregulated voltage (e.g., 3.3V) received via a port of the MMW transceiver 100.

Negative Conductance LO Port Frequency Mixers

Figure 2:
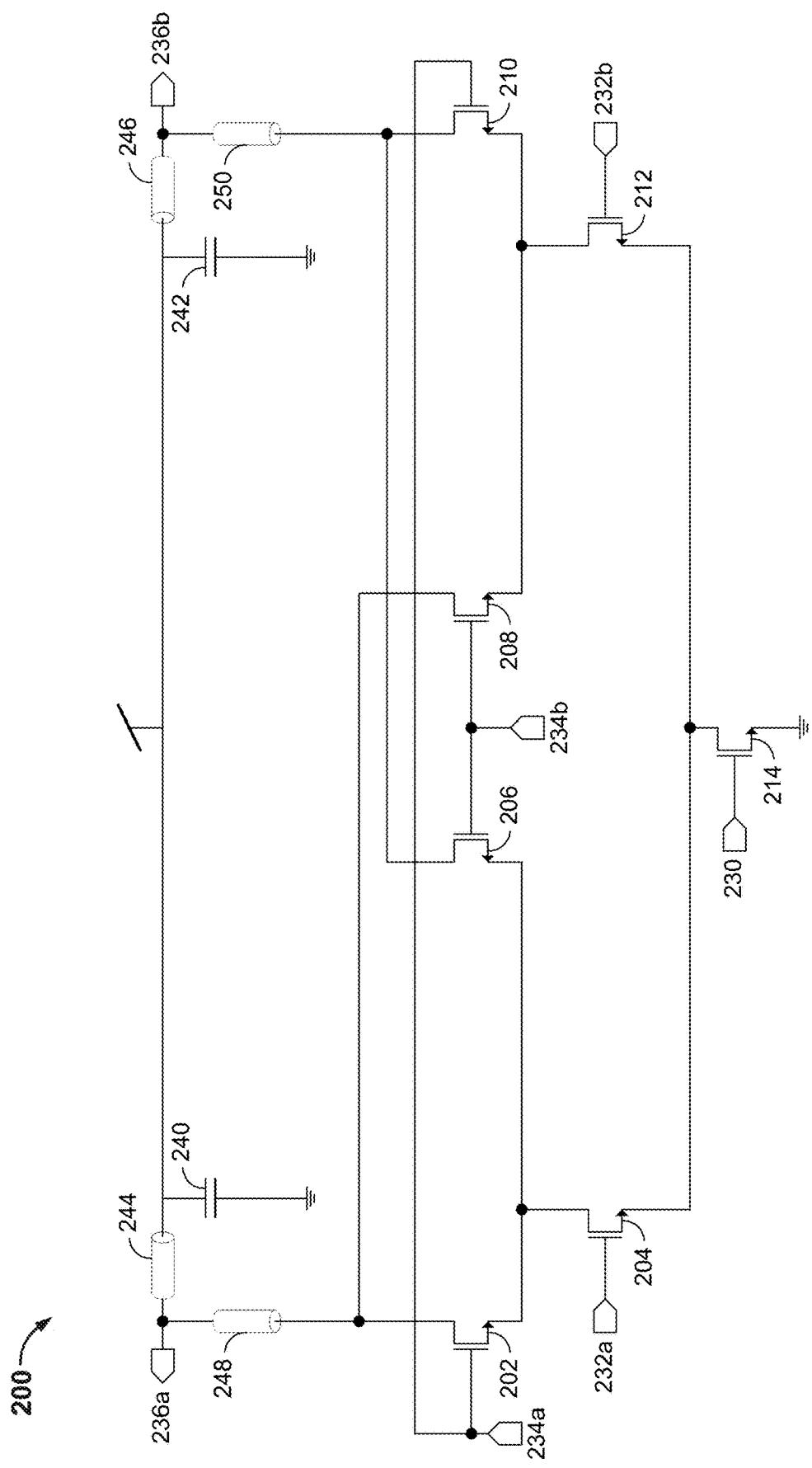
FIG. 2 illustrates a schematic of an example frequency mixer in the MMW transceiver of FIG. 1.

FIG. 2 illustrates a schematic of an example frequency mixer 200 in the MMW transceiver 100 of FIG. 1. In an embodiment, the frequency mixer 200 can function as the up-conversion frequency mixer 112 or the down-conversion frequency mixer 114. As illustrated in FIG. 2, the frequency mixer 200 does not implement negative conductance as described herein. Rather, the frequency mixer 200 represents an example Gilbert-cell frequency mixer presented merely for illustrative purposes. In particular, the frequency mixer 200 is a double-balanced Gilbert-cell frequency mixer. While the frequency mixer 200 is illustrated as a Gilbert-cell frequency mixer, this is not meant to be limiting. The techniques disclosed herein are applicable to any type of frequency mixer.

The frequency mixer 200 includes BB/IF transistors 204 and 212 (e.g., transconductance stage), LO transistors 202, 206, 208, and 210, bias transistor 214, reactive components 244, 246, 248, and 250, capacitors and 240 and 242. If the frequency mixer 200 functions as an up-conversion frequency mixer, then the gate of BB/IF transistor 204 can receive a signal 232a that is a positive version of the signal amplified by the amplifier 122 and the gate of BB/IF transistor 212 receives a signal 232b that is a negative version of the signal amplified by the amplifier 122. If the frequency mixer 200 functions as a down-conversion frequency mixer, then the gate of BB/IF transistor 204 receives a signal 232a that is a positive version of the signal amplified by the amplifier 118 and the gate of BB/IF transistor 212 receives a signal 232b that is a negative version of the signal amplified by the amplifier 118.

In an embodiment, the gates of LO transistors 202 and 210 receive a signal 234a that is a positive version of the LO signal generated by the LO 104. The gates of LO transistors 206 and 208 receive a signal 234b that is a negative version of the LO signal generated by the LO 104.

A bias signal 230 can be provided to the bias transistor 214 to affect the signal generated by the frequency mixer 200, signal 236 (e.g., signal 236a is a positive version of signal 236 and signal 236b is a negative version of signal 236). Furthermore, reactive components 244, 246, 248, and 250 and capacitors 240 and 242 can be sized and configured to generate a desired output signal 236a and 236b. If the frequency mixer 200 functions as a down-conversion frequency mixer, then the output signal 236 may be transferred to the amplifier 114. If the frequency mixer 200 functions as an up-conversion frequency mixer, then the output signal 236 is transferred to amplifier 116.

Figure 3:
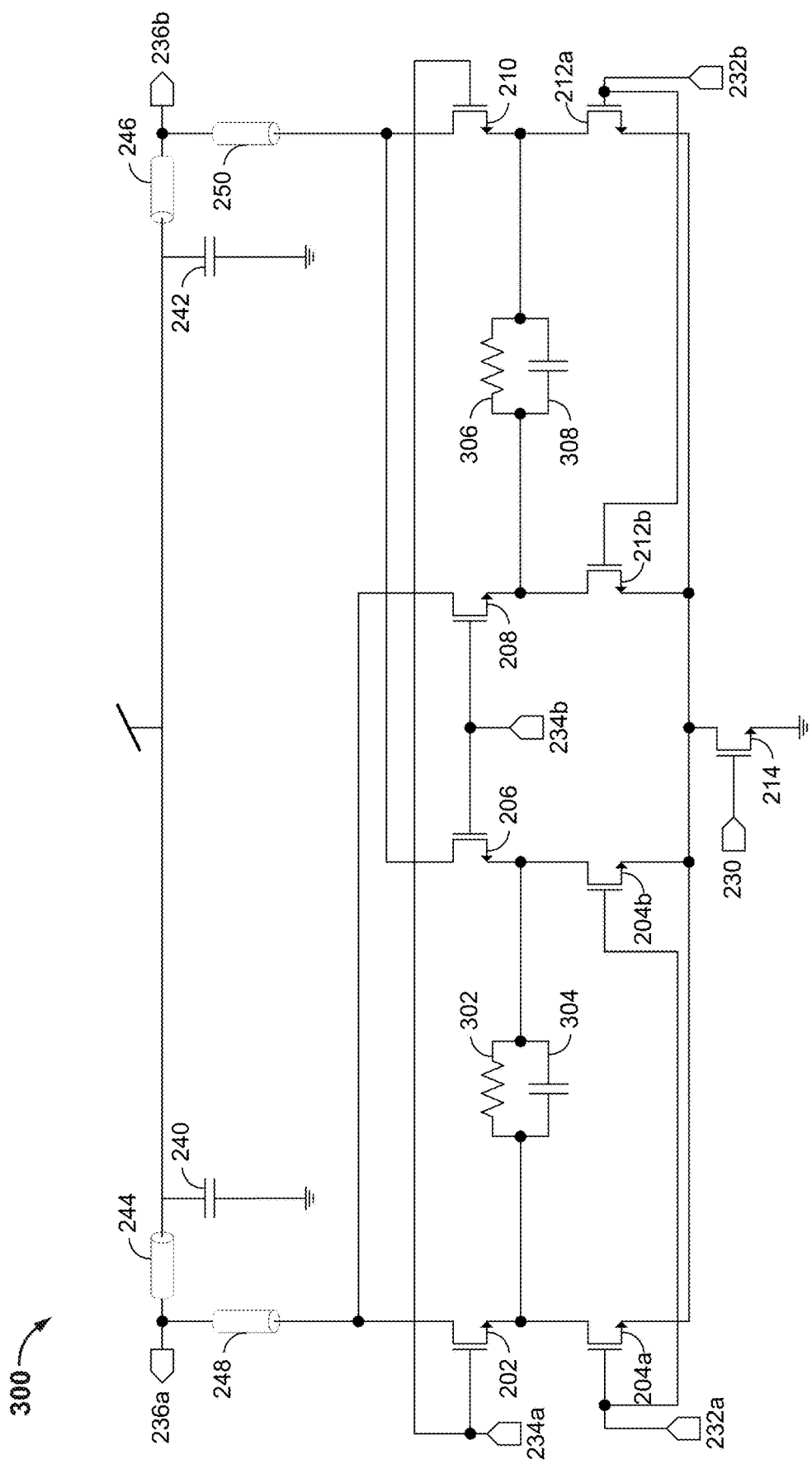
FIG. 3 illustrates a schematic of another example frequency mixer in the MMW transceiver of FIG. 1.

FIG. 3 illustrates a schematic of another example frequency mixer 300 in the MMW transceiver 100 of FIG. 1.

In an embodiment, the frequency mixer 300 can function as the up-conversion frequency mixer 112 or the down-conversion frequency mixer 114. Unlike the frequency mixer 200, the frequency mixer 300 implements negative conductance as described herein. In an embodiment, the frequency mixer 300 is a modified version of a Gilbert-cell frequency mixer, such as the double-balanced Gilbert-cell frequency mixer described above with respect to FIG. 2. While the frequency mixer 300 is illustrated as a modified version of a Gilbert-cell frequency mixer, this is not meant to be limiting. The techniques disclosed herein can be used to modify any type of frequency mixer to achieve similar results.

As described above, LO buffers and amplifiers are often used in transceivers because the MMW LO (e.g., VCO) typically cannot directly drive the combined load of conventional up/down-conversion frequency mixers and/or the frequency dividers. However, if the LO ports of the mixers have negative conductance, the negative conductance can aid oscillation start-up in the VCO. The oscillation of a VCO may be in an intentionally unstable state during start-up. By adding negative conductance to the LO ports, more energy can be reflected back to the VCO, as described above. This reflected energy facilitates the unstable start-up of the VCO, thereby shortening VCO start-up time. In some embodiments, the use of LO buffers and amplifiers then can be avoided partially or completely with the introduction of negative conductance.

As illustrated in FIG. 3, the frequency mixer 300 is an example negative conductance LO port frequency mixer that can provide at least some of the advantages described herein. In an embodiment, the frequency mixer 300 is a modified version of the frequency mixer 200 such that the frequency mixer 300 has negative input conductance by using capacitive degeneration in the LO differential pair (e.g., the LO transistors 202, 206, 208, and 210). For instance, capacitive degeneration may be implemented by replacing or augmenting the BB/IF transistors 204 and 212 with BB/IF transistors 204a, 204b, 212a, and 212b and inserting an RC-network (e.g., resistor 302 coupled in parallel with capacitor 304 and resistor 306 coupled in parallel with capacitor 308) across the drains of BB/IF transistors 204a, 204b, 212a, and 212b. While aspects of the disclosure refer herein to the "drain" or "source" of a transistor, "drain" and "source" may be interchangeable depending on the type of transistor used to implement the features described herein. The RC-network may be designed to obtain a desired look-in admittance in the LO port (e.g., gates of LO transistors 202, 206, 208, and 210). Alternatively, other components that exhibit the same behavior as an RC-network, such as one or more transistors, may be inserted in the frequency mixer 300 in place of the RC-network. In an embodiment, bias transistor 214 (e.g., the current-sink transistor) can be omitted to tackle voltage headroom issues.

Changing the frequency mixer 200 from a Gilbert-cell frequency mixer to a negative conductance LO port frequency mixer like frequency mixer 300, in one example implementation, may increase the LO signal by more than about 10 dB where the LO 104 (e.g., VCO) directly feeds the frequency mixers without LO buffers. The up-conversion gain may also increase, in one example implementation, by more than about 7 dB when using the negative conductance LO port frequency mixer, illustrating the effectiveness of certain embodiments described herein. It is also found that in one implementation, the negative conductance LO port frequency mixer has about 22% lower susceptance (e.g., capacitive loading), thus enabling the LO 104 to support additional loading in other frequency mixers or frequency dividers for a desired LO tuning range, in some embodiments.

In certain embodiments, the negative conductance LO port frequency mixers described herein may also have lower capacitance in the LO port, enabling the LO 104 to support higher capacitive loads in other frequency mixers and frequency dividers.

Co-Design of Up-Conversion Mixer, Down-Conversion Mixer, and Frequency Divider

In some embodiments, the frequency mixer 300 described above can be used in a currently-available MMW transceiver design using 50Ω impedances. However, in other embodiments, some or all the blocks fed by the MMW LO 104, including the up-conversion mixer 112, down-conversion mixer 114 and/or the frequency divider, can be co-designed as one block (e.g., designed to be implemented on-chip) with improved LO signal routing.

Figure 4:
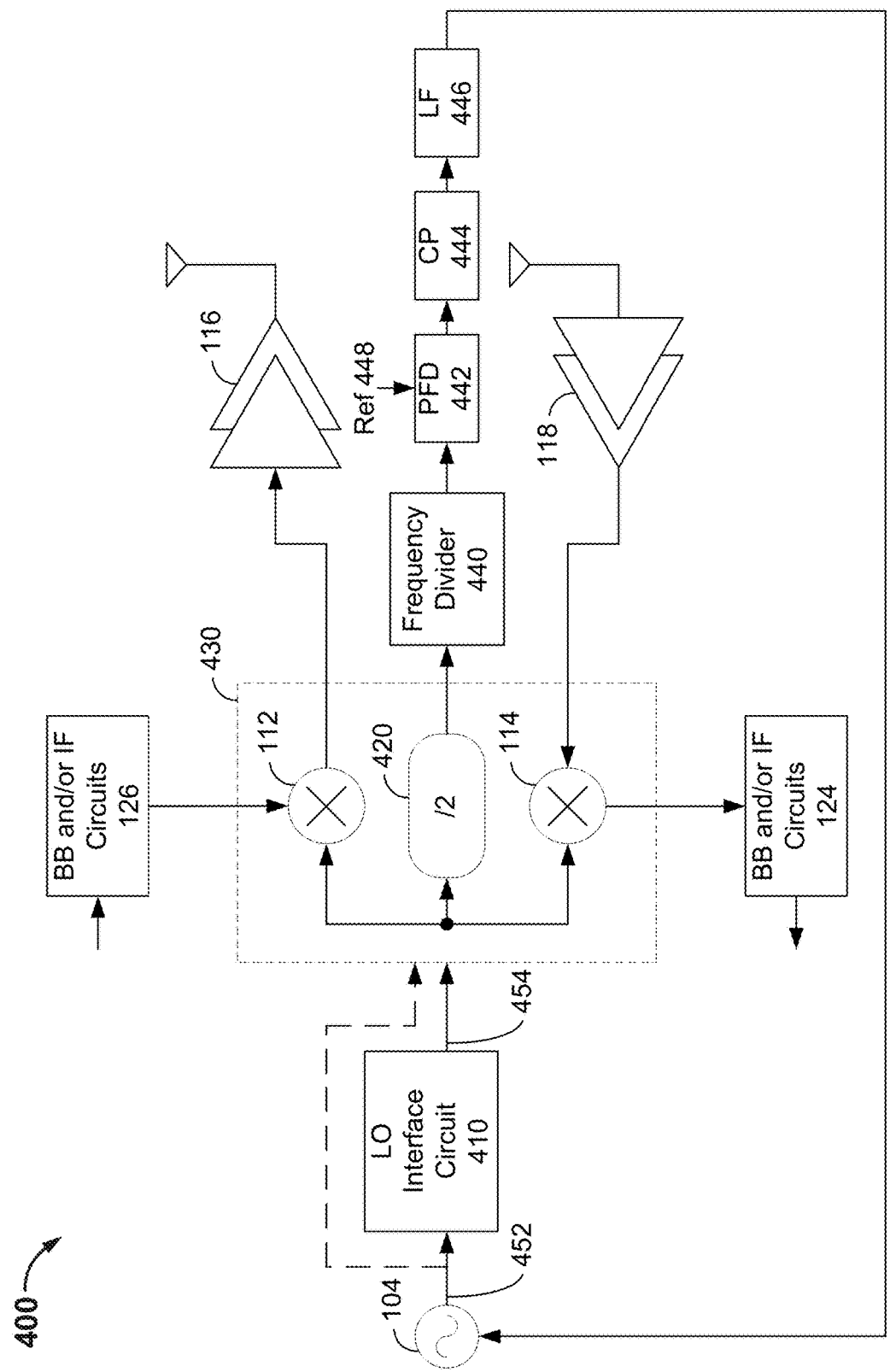
FIG. 4 illustrates an example transceiver portion where the combined LO port conductance of a co-designed block is negative.

FIG. 4 illustrates an example transceiver portion 400 where the combined LO port conductance of a co-designed block 430 is negative. In many devices that do not implement negative conductance, an increase in current entering a port results in an increase in voltage across the same port. However, in certain devices described herein, negative conductance occurs when an increase in current entering a port results in a decrease in voltage across the same port. As illustrated in FIG. 4, the co-designed block 430 includes the up-conversion frequency mixer 112, the down-conversion frequency mixer 114, and a frequency divider 420. In some embodiments, the co-designed block 430 includes an LO port that receives a signal generated by the LO 104 (e.g., signal 452), such as when negative conductance is generated by one or more components of the co-designed block 430. In other embodiments, the co-designed block 430 includes an LO port that receives a signal generated by the LO 104 that is modified by LO interface circuit 410 (e.g., signal 454), as described in greater detail below. The transceiver portion 400 (and the transceiver as a whole) may be a compact, low power, and low cost alternative to existing systems in certain embodiments without any degradation in performance.

After the signal received by the co-designed block 430 passes through the frequency divider 420, the signal may pass through additional analog and/or digital components, such as a frequency divider 440, a phase frequency detector (PFD) 442, a charge pump (CP) 444, and a loop filter (LF) 446, before providing feedback to the LO 104. As described above, the up-conversion frequency mixer 112 can receive a signal from the BB blocks 126 before generating a signal that passes through the amplifier 116 and is ultimately transmitted via an antenna. Likewise, the down-conversion frequency mixer 114 provides a signal to the BB blocks 124 based on a signal received by the amplifier 118 via the antenna.

In some embodiments, the negative conductance in the LO port of the co-designed block 430 can be generated by using techniques like capacitive degeneration in one or more of the frequency mixers 112 and/or 114 and/or frequency divider 420 (e.g., such as by using the techniques described above with respect to FIG. 3). For example, when the negative conductance is solely due to the up-conversion frequency mixer 112, it is found in one example implementation that the increase in LO swing due to the negative conductance can boost the gain of the existing down-conversion frequency mixer 114 also by more than about 7.5 dB. The co-designed block 430 may receive signal 452 directly from the LO and/or not receive signal 454 from the LO interface circuit 410.

In other embodiments, a compact, low power LO interface circuit 410 can also be used, as part of the co-designed up/down conversion frequency mixers 112 and 114 and frequency divider 420, to generate the negative LO port conductance. A more detailed schematic of the LO interface circuit 410 is illustrated in FIG. 5.

Figure 5:
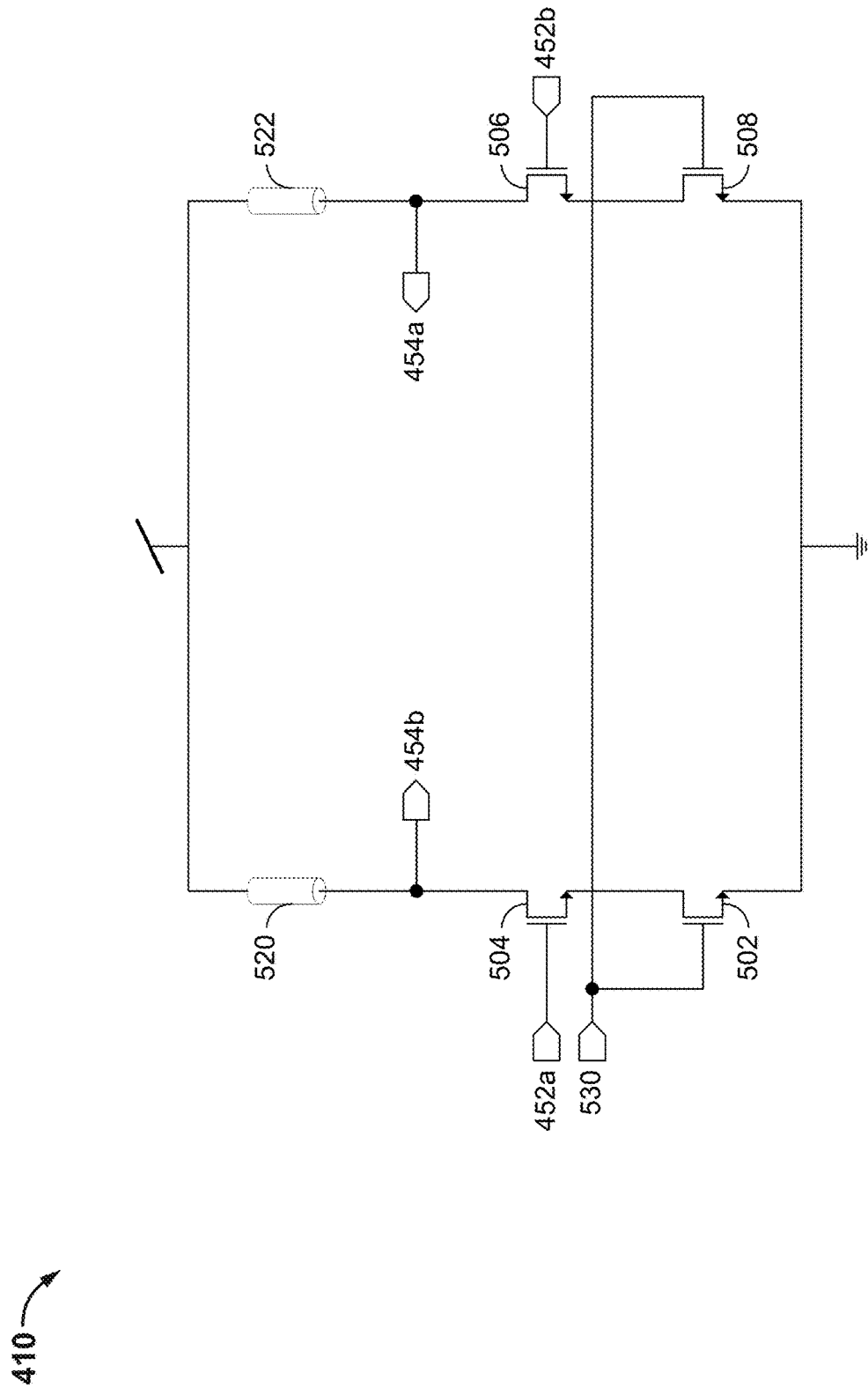
FIG. 5 illustrates an example schematic of the LO interface circuit of FIG. 4.

FIG. 5 illustrates an example schematic of the LO interface circuit 410 described above with respect to FIG. 4. The LO interface circuit 410 can provide a negative conductance at the LO port of the co-designed block 430. In an embodiment, the LO interface circuit 410 uses capacitive degeneration to generate the negative LO port conductance and supplies the LO signal to the frequency mixers 112 and 114 and the frequency divider 520 in the co-designed block 430.

The LO interface circuit 410 can receive the signal 452 generated by the LO 104 and generate the signal 454. As illustrated in FIG. 5, a transistor 504 can receive a positive version of the signal 452 (e.g., 452*a*) and a transistor 506 can receive a negative version of the signal 452 (e.g., 452*b*). The drain of the transistor 504 serves as a negative version of the signal 454 (e.g., 454*b*) and the drain of the transistor 506 serves as a positive version of the signal 454 (e.g., 454*a*). Reactive components 520 and/or 522 can be sized to generate a desired signal 454.

In some embodiments, capacitive degeneration can be implemented by adding a linear-region degeneration transistor (e.g., with programmable gate bias) in a pseudo-differential common-source amplifier. For example, as illustrated in FIG. 5, example degeneration transistors 502 and 508 can be operated in the linear region via a control signal 530 (received from, for example, the digital enhancement and control unit 140). By operating in the linear region, the degeneration transistors 502 and 508 may act like capacitors, which can remove or reduce the need to add additional capacitors. The sizing of the degeneration transistors 502 and 508 can be chosen for generating a desired look-in admittance at the LO port. The $V_{GS}$ of the degeneration transistors 502 and 508 can be programmable (via the control signal 530) to control both the LO port look-in admittance and the output power.

In several embodiments, the reduced capacitive load and the higher negative conductance of the frequency mixer 300 and/or the LO interface circuit 410 make the LO 104 more robust, increasing the tuning range of the LO 104, increasing the conversion gain of one or more of the frequency mixers 112 and 114, and also allowing the LO 104 to oscillate at higher frequencies compared to currently-available design techniques.

Integrated Homodyne Receiver with MMW Automatic Gain Control

Figure 6:
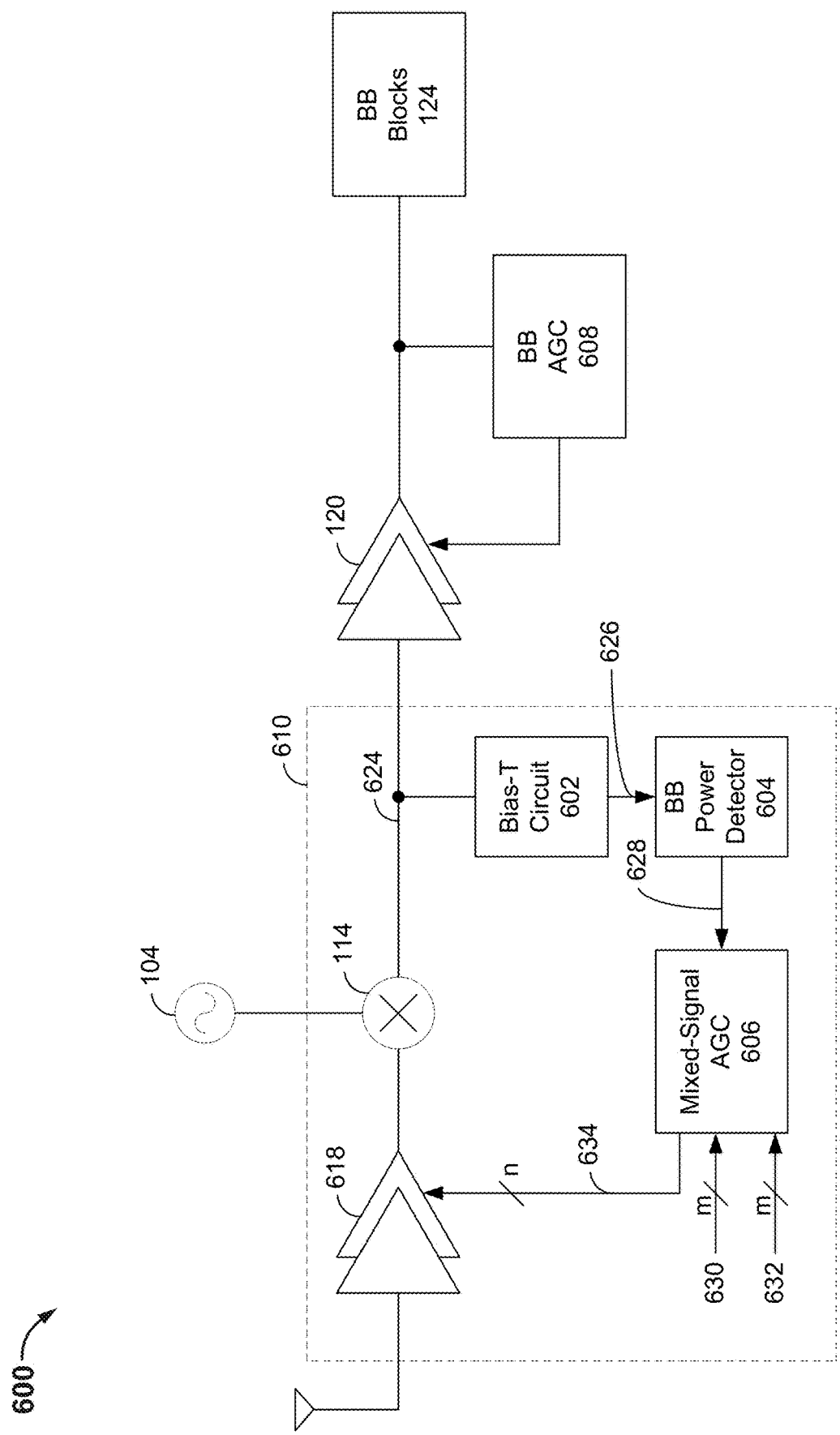
FIG. 6 illustrates an example MMW automatic gain control (AGC) circuit as part of an integrated MMW homodyne receiver.

FIG. 6 illustrates an example MMW automatic gain control (AGC) circuit 610 as part of an integrated MMW homodyne receiver 600. The use of the MMW AGC circuit 610 may increase the dynamic range of the receiver 600 over and above what is achieved by using gain control only in IF or BB blocks. As illustrated in FIG. 6, the MMW AGC circuit 610 includes the amplifier 618, the down-conversion frequency mixer 114, a bias-T circuit 602, a BB power detector 604, and a mixed-signal AGC 606. In some embodiments, the down-conversion frequency mixer 114 is the frequency mixer 300 described above with respect to FIG. 3. In some embodiments, the amplifier 618 is a programmable gain multi-stage MMW LNA, where the gain of the amplifier 618 can be controlled via a digital control signal. In further embodiments, the amplifier 618 is similar to the amplifier 118 described above with respect to FIG. 1.

In certain embodiments, when the MMW input power of the receiver 600 is within the designed limits, the output of the MMW front-end (e.g., MMW AGC circuit 610) may be between the minima and maxima set by two m-bit digital inputs 630 and 632 to the mixed-signal AGC 606. The output of the MMW AGC circuit 610 can be set in such a way by generating an n-bit gain control signal 634 for the amplifier 618. The amplifier 618 may be biased using a programmable DC biasing block that changes the gain of the amplifier 618 without significantly changing input and output matching.

In an embodiment, the BB power detector 604 can detect the power level of a signal 624 generated by the down-conversion frequency mixer 114. In other embodiments, the BB power detector 604 can detect any characteristic of the signal 624. The bias-T circuit 602 may serve as an interface between the signal 624 and the BB power detector 604. As described in greater detail below with respect to FIG. 8, the bias-T circuit 602 can prevent or reduce loss in signal 624 and prevent or reduce the amount of noise injected into the signal 624 by the BB power detector 604. The bias-T circuit 602 can generate a signal 626 that is a representation of the signal 624.

The BB power detector 604 processes the signal 626 and provides a signal 628 to the mixed-signal AGC 606. In an embodiment, the BB power detector 604 processes the signal 626 to determine the power level of the signal 626, which is represented as signal 628. The mixed-signal AGC 606 compares the signal 628 with m-bit digital input 630 and m-bit digital input 632 in order to generate the n-big gain control signal 634. The mixed-signal AGC 606 is described in greater detail below with respect to FIG. 7.

Since the down-conversion frequency mixer 114 is already a part of the receiver chain as illustrated in FIG. 1, the circuit overhead for implementing the MMW AGC circuit 610 may be substantially reduced. Also, in various embodiments, there is almost no performance penalty in terms of system gain, linearity, or noise figure because there are no additional blocks or loading in the signal path at MMW frequencies. The BB power detector 604 may effectively detect the output power of the amplifier 618 because, in certain embodiments, the down-conversion frequency mixer 114 can have a constant gain.

In some embodiments, the MMW AGC circuit 610 reduces the power consumption in the MMW amplifiers (and IF amplifiers in heterodyne embodiments described below), such as the amplifier 618, in case of higher input power. Thus, the MMW AGC circuit 610 may increase the power efficiency of the receiver 600 (or an overall transceiver system) while optionally increasing the dynamic range of the same. In some implementations, a reduction of about 10-15% in the current is observed in a typical receiver implementation at 60 GHz or other frequencies in case of high input power.

The MMW AGC circuit 610 may be coupled to an antenna, the LO 104, and the amplifier 120. The amplifier 120, like the amplifier 618 can also be a programmable gain amplifier. Accordingly, BB AGC 608 can monitor the signal generated by the amplifier 120 and provide control signals to the amplifier 120 to adjust the output of the amplifier 120. The signal generated by the amplifier 120 can be transferred to the BB blocks 124 for further processing.

The BB AGC 608 can operate simultaneously with the MMW AGC circuit 610 since the MMW AGC circuit 610 may be independent of the gain settings and the power output of the BB AGC 608 and there may be no feedback from the BB AGC 608 to the MMW AGC circuit 610. The MMW AGC circuit 610 may increase the overall dynamic range of the receiver 600, for example, by changing the MMW front-end gain in response to the input power being beyond the range of the BB AGC 608.

Figure 7:
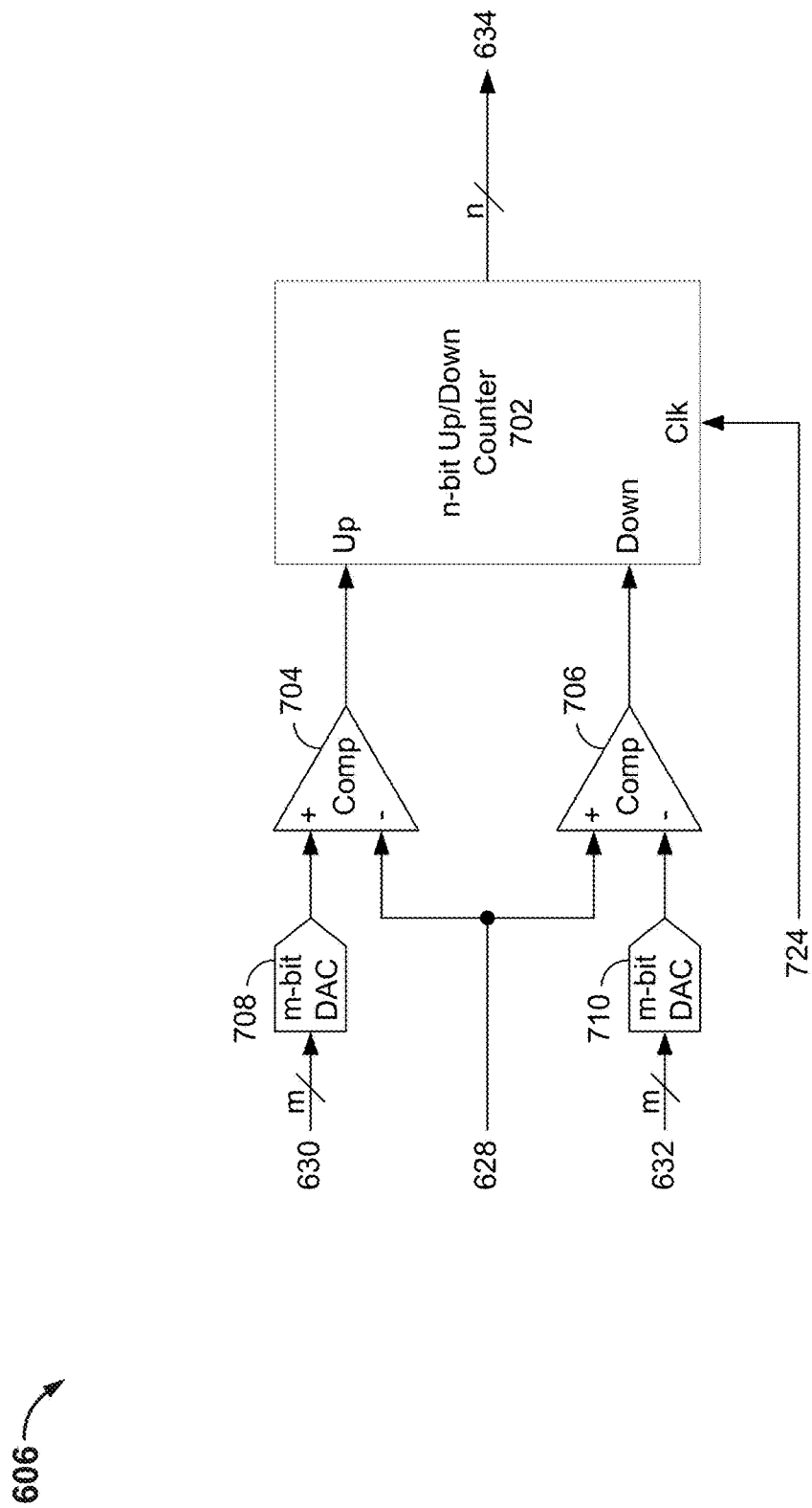
FIG. 7 illustrates an example mixed-signal AGC.

FIG. 7 illustrates an example mixed-signal AGC, such as the mixed-signal AGC 606 of FIG. 6. As illustrated in FIG. 7, the mixed signal AGC 606 includes digital-to-analog converters (DACs) 708 and 710, comparators 704 and 706, and a counter 702. In an embodiment, the counter 702 is an up/down n-bit counter that controls the gain of the amplifier 618 via the generation of signal 634.

In an embodiment, the DACs 708 and 710 are m-bit DACs. The DAC 708 can receive, as an input, an indication of the minimum desired power level of the signal generated by the amplifier 618 via signal 630. The DAC 710 can receive, as an input, an indication of the maximum desired power level of the signal generated by the amplifier 618 via signal 632. The comparator 704 is configured to compare the minimum desired power level with the detected power level, represented by the signal 628. Likewise, the comparator 706 is configured to compare the maximum desired power level with the detected power level. Both comparators 704 and 706 generate digital signals as outputs In some embodiments, the counter 702 counts up if the detected power level is less than the minimum desired power level and counts down if the detected power level is greater than the maximum desired power level. The counter 702 may stop counting at the two edges (e.g., all 0's or all 1's) and if the BB power detector 604 output (e.g., signal 628) is within the minimum desired power level and the maximum desired power level.

The frequency of the clock of the counter 702 may be sufficiently low to enable the MMW amplifiers, down-conversion frequency mixers and power detectors to settle before the next clock edge. In some embodiments, the frequency can therefore ensure or attempt to ensure the stability of the AGC loop (e.g., the MMW AGC circuit 610) if the minimum desired power level and the maximum desired power level are sufficiently apart. The two-level mixed-signal AGC 606 not only allows a simple mixed-signal implementation in various implementations, but may also fully utilize inherent dynamic range of the circuits following the MMW AGC circuit 610 (e.g., the amplifier 120, the BB blocks 124, etc.).

A component of the receiver 600 can read the count value from the counter 702 and store the count value in a register. Thus, the state of the AGC loop can be easily saved for later use in the receiver 600. Similarly, the same component or a different component of the receiver 600 can retrieve a saved state (e.g., from a register) and load the saved state into the counter 702 to start the mixed-signal AGC 606 in a particular state rapidly or instantaneously, leading to quick settling of the AGC loop in some embodiments.

Bias-T Circuit

Figure 8:
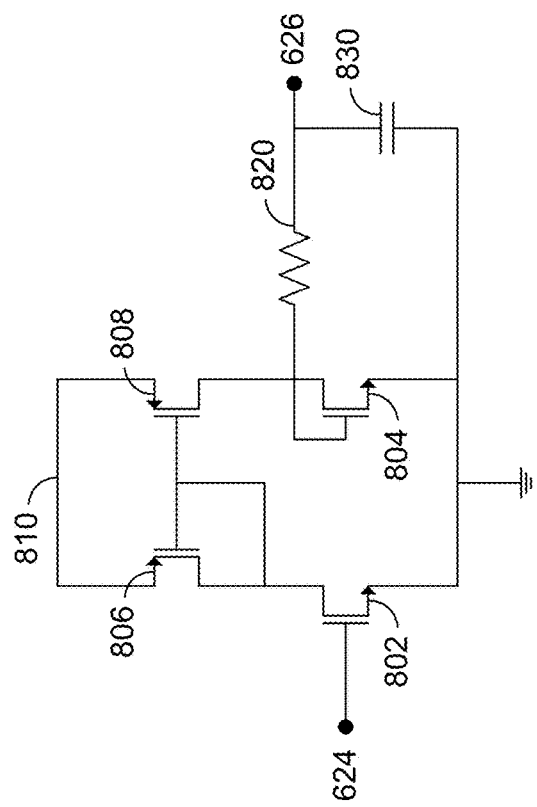
FIG. 8 illustrates an example bias-T circuit.

FIG. 8 illustrates an example bias-T circuit, such as the bias-T circuit 602 of FIG. 6. As illustrated in FIG. 8, the bias-T circuit 602 includes transistors 802, 804, 806, and 808, resistor 820, and capacitor 830. In an embodiment, transistors 802, 804, 806, and 808 form an active portion of the bias-T circuit 602, and resistor 820 and capacitor 830 form a passive portion of the bias-T circuit 602.

In an embodiment, an input signal is coupled to the gate of the transistor 802. For example, the signal in the signal path of receiver 600, signal 624, is coupled to the gate of the transistor 802. Thus, the bias-T circuit 602 appears to have a high impedance when looking into the bias-T circuit 602 from the signal path of the receiver 600. Furthermore, transistors 806 and 808 are flipped so that the source of each transistor 806 and 808 is coupled to supply 810. In this way, the bias-T circuit 602 exhibits signal separation. The signal 624 is decoupled or (in certain embodiments) isolated from supply 810, which decoupling can reduce noise injected into the signal 624 and the signal path of the receiver 600. In some embodiments, the decoupling of the signal 624 from the supply 810 also reduces or eliminates the likelihood of signal loss.

The resistor 820 is coupled to the capacitor 830 to form a low pass filter. The output of the low pass filter, signal 626, is also the output of the bias-T circuit 602. In an embodiment, the signal 626 is a low frequency representation of the signal 624 (e.g., between 20 MHz-100 MHz). For example, the low pass filter of the bias-T circuit 602 can preserve the relative magnitude and phase of the signal 624 in generating the signal 626. One or more components of the MMW transceiver 100 may monitor the relative magnitude and/or phase of a signal in the signal path to determine whether the MMW transceiver 100 is operating as desired. If the MMW transceiver 100 is not operating as desired, one or more components of the MMW transceiver 100 can use the relative magnitude and/or phase to make the appropriate adjustments. For instance, the mixed-signal AGC 606 can monitor the relative magnitude and/or phase of the signal 624 to determine whether the amplifier 618 is operating as desired and/or whether the gain of the amplifier 618 should be adjusted. Although a first-order low-pass filter is shown, higher order filters may be implemented in other embodiments, including filters with additional resistors and capacitors.

In some embodiments, the bias-T circuit 602 can serve as an interface between any of the components or subsystems of the MMW transceiver 100 and devices that monitor such components or subsystems. The bias-T circuit 602 can provide information about the operation of such components or subsystems to the monitoring devices. For example, such information can include the magnitude, gain, noise, phase, and/or variation of signals generated by or passing through the components or subsystems. Based on the information provided by the bias-T circuit 602, such monitoring devices then can adjust operation of the components or subsystems to improve the performance of the MMW transceiver 100.

In some embodiments, because the bias-T circuit 602 includes just four transistors rather than the fifteen to twenty transistors typically seen in biasing circuits, the bias-T circuit 602 can handle a larger range of frequencies, has a more compact design, and consumes less power than traditional biasing circuits.

Integrated Heterodyne Receiver with MMW Automatic Gain Control

Figure 9:
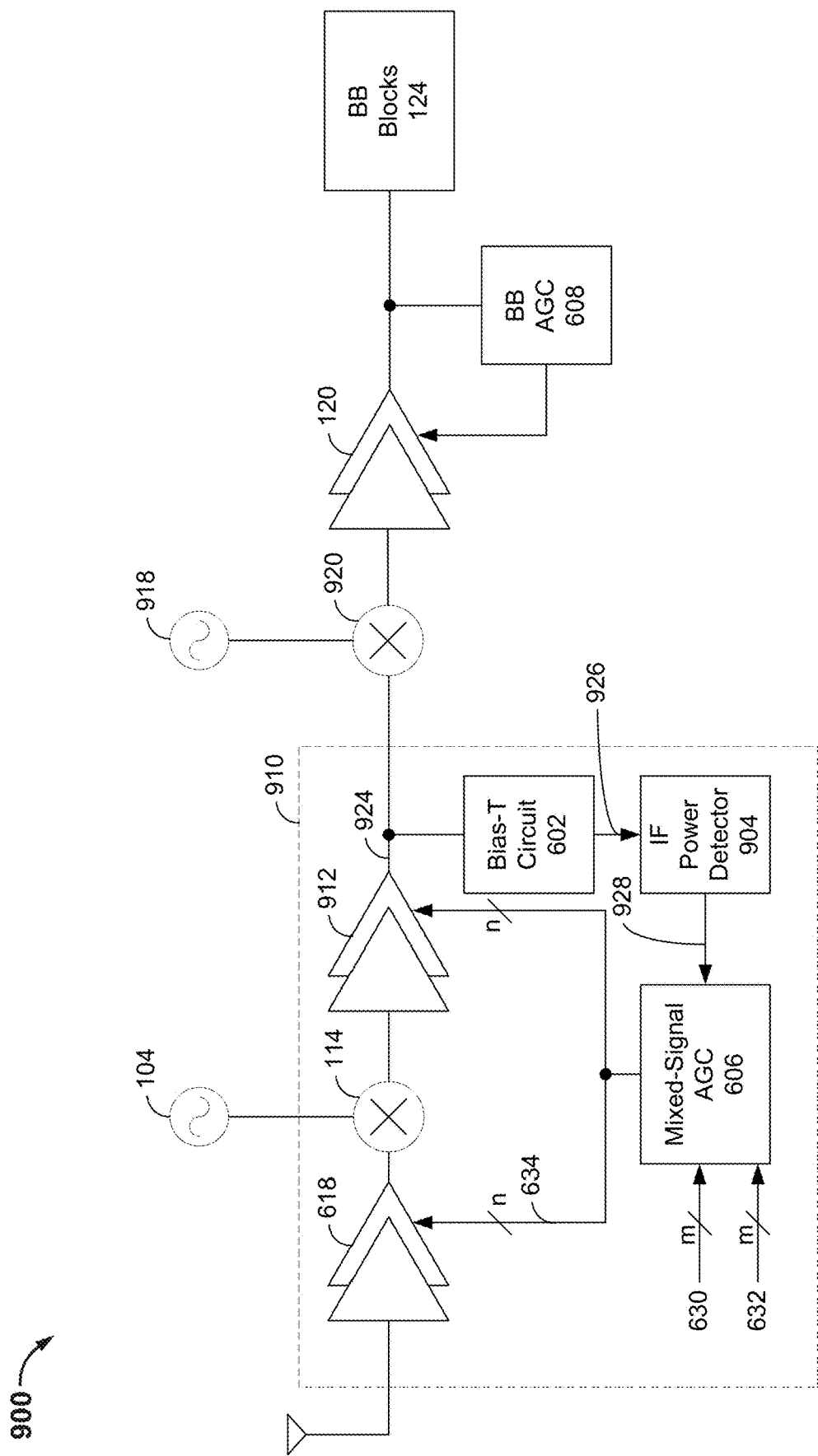
FIG. 9 illustrates an example MMW AGC circuit as part of an integrated MMW heterodyne receiver.

FIG. 9 illustrates an example MMW AGC circuit 910 as part of an integrated MMW heterodyne receiver 900. As illustrated in FIG. 9, the MMW AGC circuit 910 includes the amplifier 618, the down-conversion frequency mixer 114, amplifier 912, bias-T circuit 602, IF power detector 904, and mixed-signal AGC 606. In some embodiments, the down-conversion frequency mixer 114 is the frequency mixer 300 described above with respect to FIG. 3. In some embodiments, amplifier 618 is a programmable gain multi-stage MMW LNA and the amplifier 912 is a programmable gain IF amplifier, where the gain of amplifiers 618 and 912 can be controlled via a digital control signal.

In an embodiment, the MMW AGC circuit 910 operates similarly to the MMW AGC circuit 610 described above with respect to FIG. 6. However, the MMW AGC circuit 910 includes an IF power detector 904 instead of the BB power detector 604 and includes another amplifier 912. As illustrated in FIG. 9, the mixed-signal AGC 606 controls the gain of both the amplifier 618 and the amplifier 912 in a manner as described above with respect to FIGS. 6 and 7.

In an embodiment, IF power detector 904 monitors the characteristics of signal 924 (e.g., the power level) via the bias-T circuit 602. As explained above, power detection can be performed after first down-conversion to IF to avoid additional MMW loading and associated performance degradation in the receiver 900 line-up. The bias-T circuit 602 provides signal 926 to the IF power detector 904, where the signal 926 may be a low frequency representation of the signal 924. The IF power detector 904 processes the signal 926, generating signal 928, which may include an indication of the power level of the signal 924. The IF power detector 904 is described in greater detail with respect to FIGS. 10A-10B.

The receiver 900 further includes LO 918 and down-conversion frequency mixer 920, which are used to convert signal 924 from IF to BB. The receiver 900 may also include amplifier 120, BB AGC 608, and/or BB blocks 124 as described above with respect to FIG. 6.

Figure 10A:
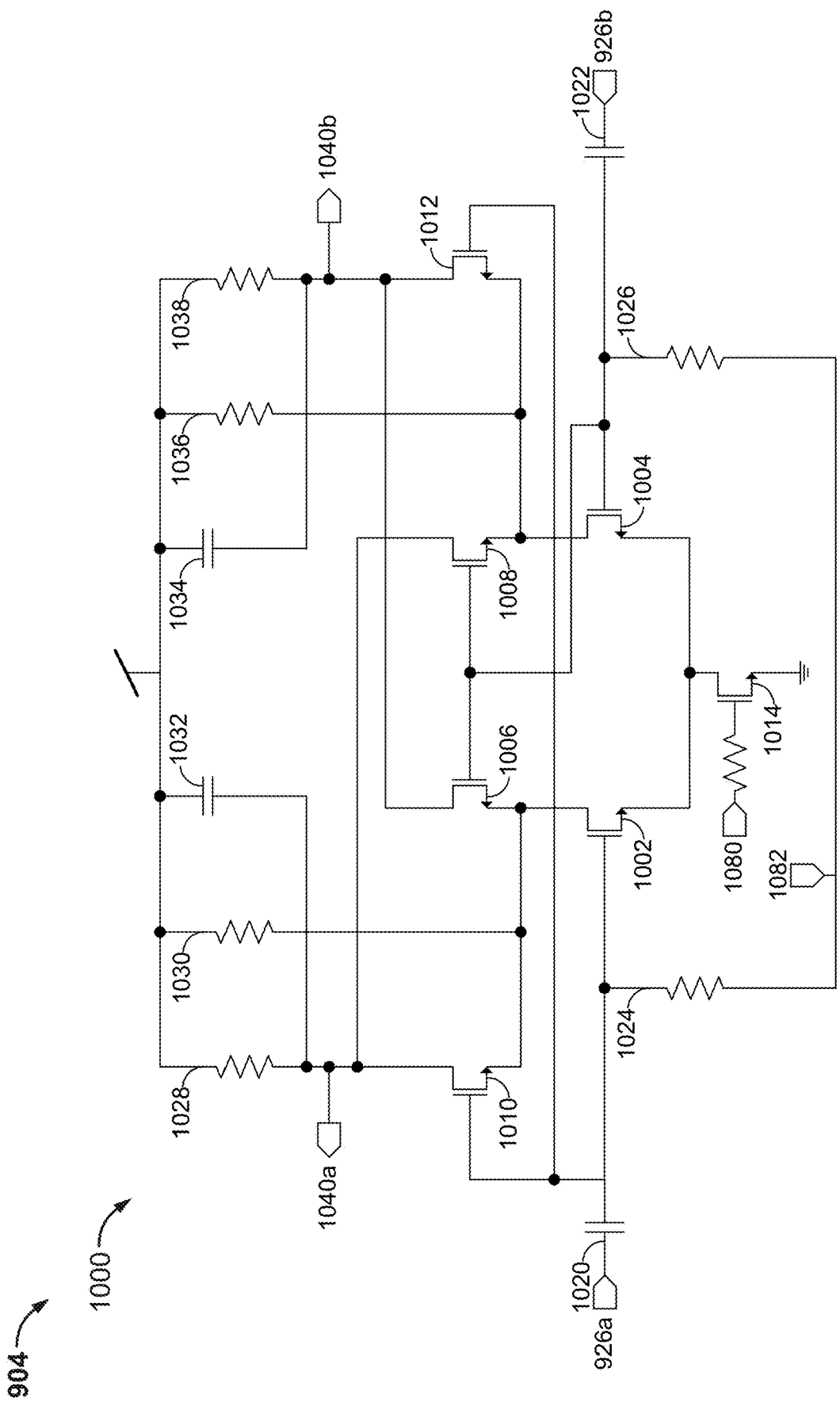
FIGS. 10A-10B illustrate an example IF power detector.
Figure 10B:
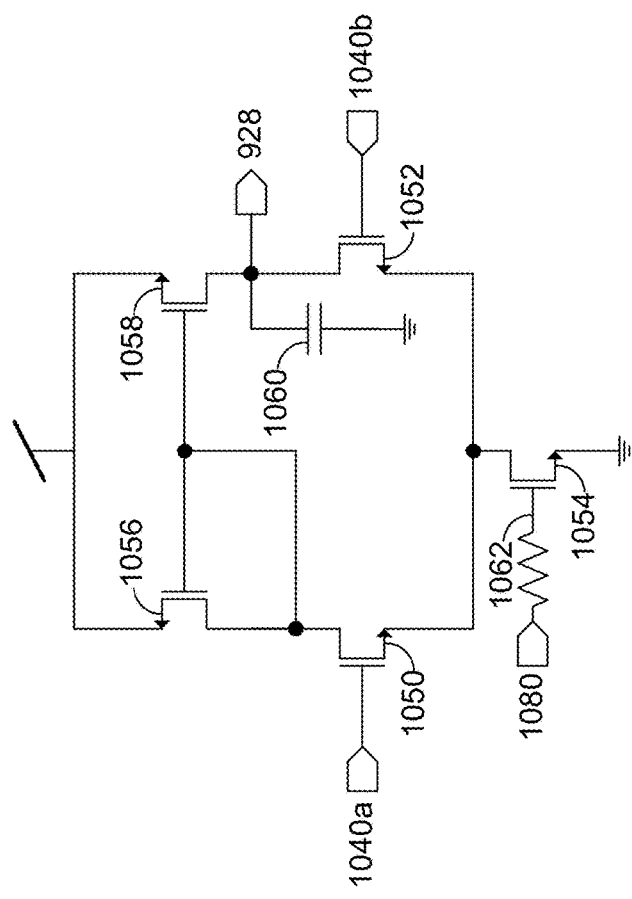

FIGS. 10A-10B illustrate an example IF power detector, such as the IF power detector 904 of FIG. 9. As illustrated in FIGS. 10A and 10B, the IF power detector 904 includes differential amplifier 1000 (FIG. 10A) and a differential-to-single-ended amplifier 1090 (FIG. 10B). As an example, the IF power detector 904 is illustrated as a Gilbert-cell frequency mixer based multiplier. However, this is not meant to be limiting as the IF power detector 904 can be any frequency mixer based multiplier. In some embodiments, not shown, the IF power detector 904 can implement the negative conductance features described above with respect to the frequency mixer 300 of FIG. 3.

In an embodiment, the output of the differential amplifier 1000, signals 1040a (e.g., positive) and 1040b (e.g., negative), can be fed to the differential-to-single-ended amplifier 1090 for the final single-ended output 928. To increase the sensitivity of the IF power detector 904, bigger input devices may be used than in currently-available IF power detectors. For example, transistors 1010, 1006, 1008, and 1012 can be sized to 20 μm, transistors 1002 and 1004 can be sized to 15 μm, transistors 1050 and 1052 can be sized to 3 μm, transistors 1056 and 1058 can be sized to 48 pm, resistors 1028 and 1038 can be 2KΩ, resistors 1030 and 1036 can be 2.3KΩ, capacitors 1032 and 1034 can be 850 fF, and capacitor 1060 can be 2.5 pF. However, the load inductor in the final stage of the amplifier 912 may be tuned with the total load capacitance, and the additional IF power detector 904 loading may not affect the IF chain performance.

In some embodiments, the differential-to-single-ended amplifier 1090 has a larger size than conventional differential-to-single-ended amplifiers. For example, the differential-to-single-ended amplifier 1090 may be two, three, four, five, six, seven, eight, nine, or ten times as large in area as a conventional differential-to-single ended amplifier. In certain embodiments, the differential-to-single-ended amplifier 1090 being five times as large in area as a conventional different-to-single-ended amplifier has certain benefits. By increasing the size of the differential-to-single-ended amplifier 1090, the IF power detector 904 can be improved or optimized for loading such that the signal path in the receiver 900 sees a high impedance when looking into the IF power detector 904. In fact, the increased size may not only decrease loading, but may also increase the sensitivity of the differential-to-single-ended amplifier 1090. In an embodiment, the results discussed above can be achieved when the differential amplifier 1000 and the differential-to-single-ended amplifier 1090 are constructed together on-chip rather than as discrete components that are coupled together.

Flowchart

Figure 11:
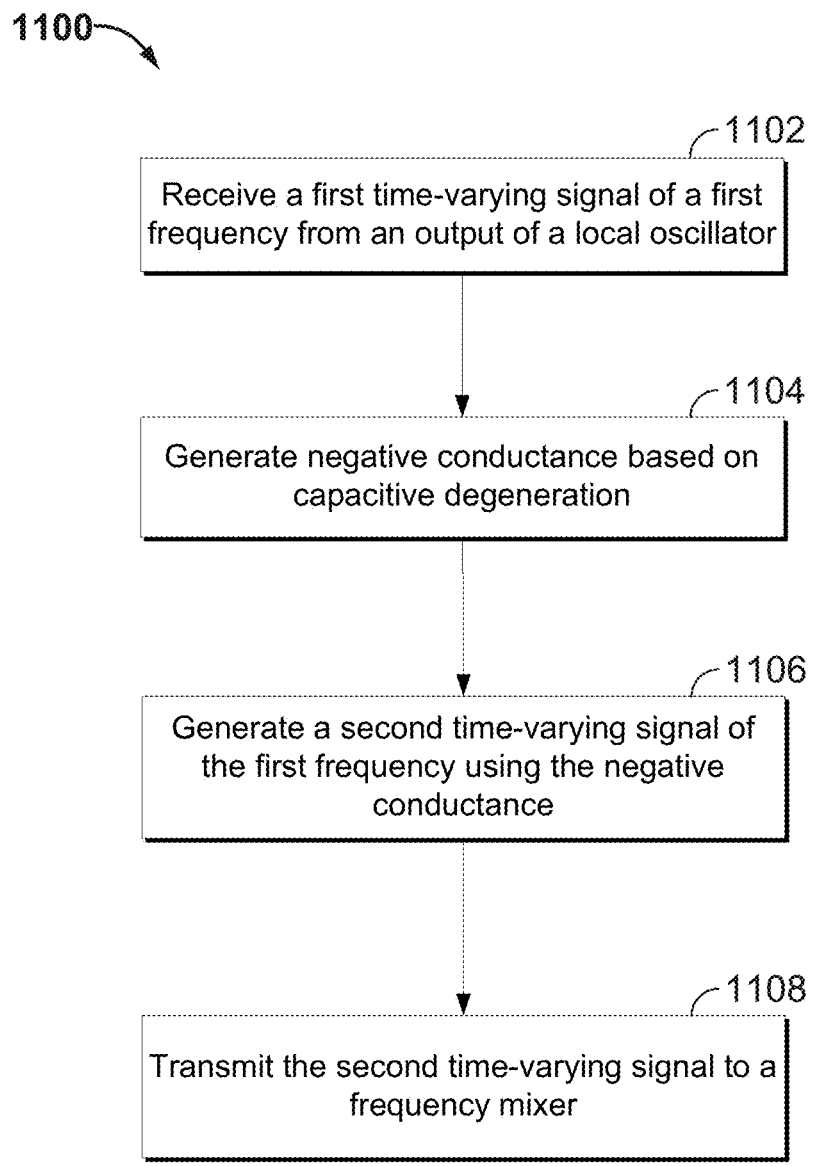
FIG. 11 illustrates a flowchart of an embodiment of a method for reducing power consumption in a wireless data receiver.

FIG. 11 illustrates a flowchart of a method 1100 for reducing power consumption in a wireless data receiver. In an embodiment, the method 1100 can be performed by the LO interface circuit 410 discussed above with respect to FIGS. 4 and 5. Depending on the embodiment, the method 1100 may include fewer and/or additional blocks and the blocks may be performed in an order different than illustrated.

In block 1102, a first time-varying signal of a first frequency is received from an output of a local oscillator. In an embodiment, the first time-varying signal is generated for use by an up-conversion frequency mixer and/or a down-conversion frequency mixer.

In block 1104, a negative conductance based on capacitive degeneration is generated. In an embodiment, the capacitive degeneration is generated using transistors operating in a linear region. In a further embodiment, generation of the negative conductance eliminates or reduces the number of LO amplifiers needed to drive a frequency mixer.

In block 1106, a second time-varying signal of the first frequency is generated using the negative conductance. In block 1108, the second time-varying signal is transmitted to a frequency mixer. In an embodiment, the second time-varying signal is used to down-convert a MMW signal to IF or BB. In another embodiment, the second time-varying signal is used to up-convert an IF or BB signal.

Example Use Case

Figure 12:
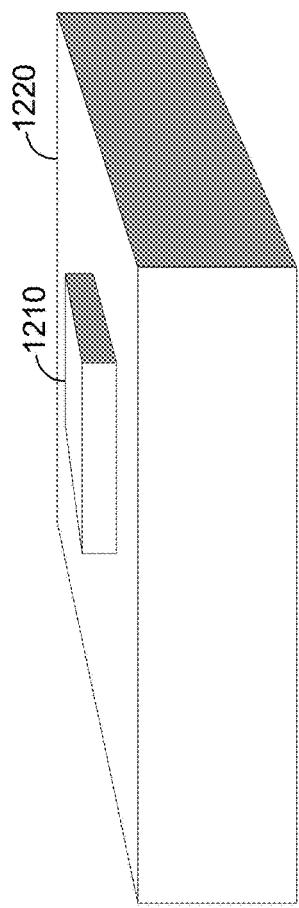
FIG. 12 illustrates an example docking system.

FIG. 12 illustrates an example docking system 1200. As illustrated in FIG. 12, the docking system 1200 can include an electronic device 1210 (e.g., a mobile phone, a tablet, a laptop, etc.) and a docking station 1220 (e.g., a television, a desktop computer, a tablet, a device that connects to another peripheral device like a television or a desktop computer, etc.). In an embodiment, the electronic device 1210 and the docking station 1220 each include a MMW transceiver, such as the MMW transceiver 100 described above. The MMW transceiver included in the electronic device 1210 and the docking station 1220 may include the features described herein. The electronic device 1210 and the docking station 1220 can communicate via wireless data transmissions using the MMW transceiver. For example, the electronic device 1210 can transmit data (e.g., RAW image files, video files, control signals, etc.) to the docking station 1220 using the MMW transceiver. Likewise, the docking station 1220 can transmit data (e.g., RAW image files, video files, control signals, etc.) to the electronic device 1210 using the MMW transceiver.

In some embodiments, the MMW transceiver is internal to the electronic device 1210 and/or the docking station 1220. For example, the MMW transceiver could be included with other radios (e.g., GSM, CDMA, Bluetooth, etc.) in the electronic device 1210 or docking station 1220. In other embodiments, not shown, the MMW transceiver can be connected to the electronic device 1210 and/or the docking station 1220 via an external connection. For example, the MMW transceiver could be included in a device that connects to the electronic device 1210 and/or the docking station 1220 via a wired connection (e.g., via USB, Ethernet, IEEE 1394, etc.). Data can then be routed between the electronic device 1210 or the docking station 1220 and the MMW transceiver via the wired connection.

Terminology

Although certain types of circuit components are shown and described herein, equivalent or similar circuit components may be used in their place in other embodiments. For instance, example field effect transistors (FETs) shown may be replaced with bipolar junction transistors (BJTs) in some embodiments. Further, NMOS FETs may be replaced with PMOS FETs and vice versa, or NPN BJTs may be replaced with PNP BJTs, and vice versa. Further, many types of FETs can be used interchangeably in the embodiments described herein with slight or no design differences, some examples of which include a CNFET, a DEPFET, a DNAFET, a FREDFET, a HEMT, an IGBT, an ISFET, a JFET, a MESFET, a MOSFET, a MODFET, a NOMFET, an OFET, and the like. Other circuit components shown, including passive components, may likewise be replaced with other electrical equivalents or similar circuits. Furthermore, the values of passive circuit elements, voltages, currents, and power (among other circuit parameters) may be chosen to satisfy any design criterion relevant to the electronic device in which the circuits are implemented.

Although the inventions disclosed herein have been described in the context of certain embodiments and examples, it should be understood that the inventions disclosed herein extend beyond the specifically disclosed embodiments to other alternative embodiments and/or uses of the inventions and certain modifications and equivalents thereof. Further, the disclosure herein of any particular feature, aspect, method, property, characteristic, quality, attribute, element, or the like in connection with an embodiment may be used in all other embodiments set forth herein. Thus, it is intended that the scope of the inventions disclosed herein should not be limited by the particular disclosed embodiments described above. As will be recognized, certain embodiments of the inventions described herein can be embodied within a form that does not provide all of the features and benefits set forth herein, as some features can be used or practiced separately from others.

Many other variations than those described herein will be apparent from this disclosure. For example, depending on the embodiment, certain acts, events, or functions of any of the methods described herein can be performed in a different sequence, can be added, merged, or left out altogether (e.g., not all described acts or events are necessary for the practice of the methods).

Conditional language used herein, such as, among others, "can," "might," "may," "e.g.," "for example," "for instance," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A wireless data transceiver, comprising:
    a voltage-controlled oscillator configured to generate a first time-varying signal;
    a first amplifier configured to amplify an antenna signal having a millimeter wave frequency received from an antenna to produce an amplified signal;
    a frequency mixer coupled to the voltage-controlled oscillator and the first amplifier, the frequency mixer configured to generate a second time-varying signal based on the first time-varying signal and the amplified signal;
    a second amplifier configured to amplify the second time-varying signal to produce an amplified second time-varying signal;
    a power detector configured to measure a characteristic of the amplified second time-varying signal; and
    an automatic gain control circuit coupled to the power detector and the first amplifier and the second amplifier, wherein the automatic gain control circuit is configured to adjust operation of the first amplifier and the second amplifier based on the measured characteristic, a minimum power setting, and a maximum power setting, wherein the automatic gain control circuit comprises an up/down counter with an output of the up/down counter connected directly to the first amplifier and the second amplifier, wherein the up/down counter instructs the first amplifier and the second amplifier to adjust operation by instructing the first amplifier and the second amplifier to increase gain and decrease gain, the automatic gain control further comprising:
        a first digital to analog converter (DAC) connected to a first comparator that drives an "up" input of the up/down counter; and
        a second DAC connected to a second comparator that drives a "down" input of the up/down counter, wherein the automatic gain control circuit is further configured to instruct the first amplifier and the second amplifier to increase gain if the measured characteristic is less than the minimum power setting, and wherein the automatic gain control circuit is further configured to instruct the first amplifier and the second amplifier to decrease gain if the measured characteristic is greater than the maximum power setting; and
    wherein the first amplifier, the frequency mixer, the second amplifier, the power detector, and the automatic gain control circuit are implemented on-chip in a manner that reduces degradation of the first time-varying signal.

2. The wireless data transceiver of claim 1, further comprising a bias circuit coupled between an output of the second amplifier and the power detector, wherein the bias circuit is configured to reduce an amount of noise injected into the amplified second time-varying signal by the power detector.

3. The wireless data transceiver of claim 2, wherein the bias circuit comprises a first transistor, and wherein a gate of the first transistor is coupled to the output of the second amplifier.

4. The wireless data transceiver of claim 3, wherein the bias circuit further comprises a second transistor and a third transistor, wherein a gate of the second transistor is coupled to a gate of the third transistor and a drain of the first transistor, and wherein a source of the second transistor and a source of the third transistor are coupled to a supply voltage.

5. The wireless data transceiver of claim 4, wherein the bias circuit further comprises a fourth transistor and a low pass filter, wherein a drain of the third transistor and a drain and a gate of the fourth transistor are coupled to the low pass filter, and wherein an output of the low pass filter is coupled to the power detector.

6. The wireless data transceiver of claim 5, wherein a bias signal at the output of the low pass filter is a representation of the amplified second time-varying signal.

7. The wireless data transceiver of claim 1, wherein the power detector is an intermediate frequency (IF) power detector.

8. The wireless data transceiver of claim 7, wherein the IF power detector comprises a differential mixer coupled to a single-ended amplifier, wherein the amplifier second time-varying signal passes to the differential mixer and the measured characteristic is output by the single-ended amplifier, and wherein the single-ended amplifier is connected to the automatic gain control circuit.

9. The wireless data transceiver of claim 8, wherein an output of the single-ended amplifier has a first impedance, wherein an output of the differential mixer has a second impedance, and wherein the first impedance is greater than the second impedance.

10. The wireless data transceiver of claim 1, wherein the first time-varying signal has a first frequency, wherein the second time-varying signal has a second frequency, and wherein the first frequency is higher than the second frequency.

11. The wireless data transceiver of claim 1, wherein the first amplifier is a millimeter wave low noise amplifier.

12. The wireless data transceiver of claim 1, wherein the second amplifier is an intermediate frequency (IF) amplifier.

13. A wireless data transceiver, comprising:
a voltage-controlled oscillator configured to generate a first time-varying signal;
a first amplifier configured to amplify an antenna signal having a millimeter wave frequency received from an antenna to produce an amplified signal;
a frequency mixer coupled to the voltage-controlled oscillator and the first amplifier, the frequency mixer configured to generate a second time-varying signal based on the first time-varying signal and the amplified signal;
a second amplifier configured to amplify the second time-varying signal to produce an amplified second time-varying signal;
a power detector configured to measure a characteristic of the amplified second time-varying signal;
an automatic gain control circuit coupled to the power detector and the first amplifier and the second amplifier, wherein the automatic gain control circuit is configured to adjust operation of the first amplifier and the second amplifier based on the measured characteristic, a minimum power setting, and a maximum power setting, wherein the automatic gain control circuit comprises an up/down counter with an output of the up/down counter connected directly to the first amplifier and the second amplifier, wherein the up/down counter instructs the first amplifier and the second amplifier to increase gain if the measured characteristic is less than the minimum power setting, and wherein the automatic gain control circuit is further configured to instruct the first amplifier and the second amplifier to decrease gain if the measured characteristic is greater than the maximum power setting, wherein the automatic gain control circuit further comprises: a first digital to analog converter (DAC) connected to a first comparator that drives an "up" input of the up/down counter; and a second DAC connected to a second comparator that drives a "down" input of the up/down counter; and
a bias circuit coupled between an output of the second amplifier and the power detector, wherein the bias circuit is configured to reduce an amount of noise injected into the amplified second time-varying signal by the power detector.

14. The wireless data transceiver of claim 13, wherein the bias circuit comprises a first transistor, and wherein a gate of the first transistor is coupled to the output of the second amplifier.

15. The wireless data transceiver of claim 14, wherein the bias circuit further comprises a second transistor and a third transistor, wherein a gate of the second transistor is coupled to a gate of the third transistor and a drain of the first transistor, and wherein a source of the second transistor and a source of the third transistor are coupled to a supply voltage.

16. The wireless data transceiver of claim 14, wherein the bias circuit further comprises a fourth transistor and a low pass filter, wherein a drain of the third transistor and a drain and a gate of the fourth transistor are coupled to the low pass filter, and wherein an output of the low pass filter is coupled to the power detector.

17. The wireless data transceiver of claim 16, wherein a bias signal at the output of the low pass filter is a representation of the amplified second time-varying signal.

18. The wireless data transceiver of claim 13, wherein the power detector is an intermediate frequency (IF) power detector comprising a differential mixer coupled to a single-ended amplifier, wherein the amplifier second time-varying signal passes to the differential mixer and the measured characteristic is output by the single-ended amplifier, and wherein the single-ended amplifier is connected to the automatic gain control circuit.

19. The wireless data transceiver of claim 18, wherein an output of the single-ended amplifier has a first impedance, wherein an output of the differential mixer has a second impedance, and wherein the first impedance is greater than the second impedance.

* * * * *